US009159442B2

(12) United States Patent
Czeides

(10) Patent No.: US 9,159,442 B2
(45) Date of Patent: Oct. 13, 2015

(54) SERIAL MEMORY WITH FAST READ WITH LOOK-AHEAD

(71) Applicant: Microchip Technology Incorporated, Chandler, AZ (US)

(72) Inventor: Silvia Czeides, Bucharest (RO)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 336 days.

(21) Appl. No.: 13/666,723

(22) Filed: Nov. 1, 2012

(65) Prior Publication Data

US 2013/0121098 A1  May 16, 2013

Related U.S. Application Data

(60) Provisional application No. 61/558,604, filed on Nov. 11, 2011.

(51) Int. Cl.
    *G11C 7/00* (2006.01)
    *G11C 16/32* (2006.01)
    *G11C 5/06* (2006.01)
    *G11C 7/22* (2006.01)

(52) U.S. Cl.
    CPC ............... *G11C 16/32* (2013.01); *G11C 5/066* (2013.01); *G11C 7/22* (2013.01)

(58) Field of Classification Search
    USPC ......... 365/83, 205, 221, 239, 230.01, 230.06, 365/235, 240
    See application file for complete search history.

(56) References Cited

U.S. PATENT DOCUMENTS

| 6,038,185 A * | 3/2000 | Ng et al. ........................ 365/221 |
| 2001/0021117 A1* | 9/2001 | Cavaleri et al. .................... 365/1 |

FOREIGN PATENT DOCUMENTS

WO     99/59154 A1    11/1999    ........... G11C 11/401

OTHER PUBLICATIONS

International Search Report and Written Opinion, Application No. PCT/US2012/064401, 9 pages, Jan. 31, 2013.

* cited by examiner

*Primary Examiner* — Thao H Bui
(74) *Attorney, Agent, or Firm* — Slayden Grubert Beard PLLC

(57) ABSTRACT

A serial memory may have memory arranged in a plurality of memory blocks, a serial interface for receiving a read instruction and associated memory address; and a controller configured to only store a plurality of most significant bits from each memory block which are accessed in parallel before an entire address has been received through the serial interface. The controller is further configured to stream out one of the plurality of most significant bits upon full reception of the memory address while retrieving the remaining bits from memory using the entire address and stream out the remaining bits after the most significant bits have been streamed out.

19 Claims, 4 Drawing Sheets

SERIAL MEMORY WITH FAST READ WITH LOOK-AHEAD

CROSS-REFERENCE TO RELATED APPLICATIONS

This application claims the benefit of U.S. Provisional Application No. 61/558,604 filed on Nov. 11, 2011, entitled "SERIAL MEMORY WITH FAST READ WITH LOOK-AHEAD", which is incorporated herein in its entirety.

TECHNICAL FIELD

The present disclosure relates to serial memory devices.

BACKGROUND

Serial memory device comprise memory, associated memory controller, power supply and a serial interface in a housing. These devices are intended as stand alone external devices that can be coupled with a microcontroller or microprocessor in systems where additional memory is needed to store data or program instructions that need to be stored in a non-volatile fashion. The housing can be very small because external pins are only required for power supply, the serial interface and optionally one or more address pins. The serial interface can be a serial peripheral interface (SPI) which generally only requires four external pins for bi-directional communication. Other serial interfaces may apply, such as $I^2C$, single wire serial busses, etc. which require even less pins.

The respective protocol used depending on the serial interface defines how data is transmitted and received. To read a specific memory location, a master device must transmit a respective request to the serial memory which includes the address from which data is to be read. Once this command has been received the serial memory device retrieves the data and sends the data back to the master. In particular, in the SPI protocol, there is only a half clock between receiving the last address and streaming out the first data byte, while the read process within the serial memory device requires two full clocks at maximum frequency. Hence, the serial memory device requires substantial decoding circuitry, in particular a high number of sense amplifiers, to provide the data and meet the SPI transmission requirements. Other serial protocols may face similar timing problems.

SUMMARY

Hence, there exists a need for an improved serial memory device.

According to an embodiment, a serial memory may comprise memory arranged in a plurality of memory blocks, a serial interface for receiving a read instruction and associated memory address; and a controller configured to only store a plurality of most significant bits from each memory blocks which are accessed in parallel before an entire address has been received through said serial interface, wherein the controller is further configured to stream out one of the plurality of most significant bits upon full reception of the memory address while retrieving the remaining bits from memory using the entire address and stream out the remaining bits after the most significant bits have been streamed out.

According to a further embodiment, the serial memory may further comprise n sense amplifiers coupled with an n-bit register, and a switching unit operable during a first access, which uses a partial address, to couple at least two most significant data bit lines from each addressed memory block with said sense amplifiers and during a second access, which uses the entire address, to couple at least the remaining least significant data bit lines provided by said memory with the sense amplifiers. According to a further embodiment, the serial memory may further comprise a multiplexer controlled by the least significant address bits to select one set of the at least two significant data bits stored in said register. According to a further embodiment, the serial interface can be an SPI interface. According to a further embodiment, data bit lines representing the most significant bits of each memory block can be accessed individually and the memory blocks share the remaining data bit lines. According to a further embodiment, the memory can be arranged in four memory blocks and two most significant bits are retrieved from each memory block. According to a further embodiment, the serial memory may comprise eight sense amplifiers coupled with an 8-bit register, and a switching unit operable during a first access, which uses a partial address, to couple the two most significant data bit lines from each addressed memory block with said eight sense amplifiers and during a second access, which uses the entire address, to couple at least the remaining least significant data bit lines provided by said memory with respective sense amplifiers of said eight sense amplifiers. According to a further embodiment, the serial memory may further comprise a multiplexer controlled by the least significant address bits to select one set of two significant data bits stored in said register.

According to another embodiment, a method of reading a serial memory arranged in a plurality of memory blocks may comprise the steps of: transmitting a read instruction and associated memory address to the serial memory via a serial interface; and receiving a partial memory address and applying said partial memory address to only store a plurality of most significant bit sets from each memory block which are accessed in parallel by means of said partial address, upon receiving the entire address:—selecting one set of most significant bits of the previously stored most significant bits and streaming out the selected most significant bits, and—addressing the memory using the entire address to retrieve at least the remaining bits while said most significant bits are streamed out; and streaming out the remaining bits after said most significant bits have been streamed out.

According to a further embodiment of the method, the partial memory address can be used to access one individual data in each memory block to form a consecutive data sequence. According to a further embodiment of the method, sense amplifiers can be coupled with the most significant bit lines of each memory block when said partial memory address is applied to said memory and wherein the sense amplifiers are coupled with at least the remaining bit lines of said memory when said entire address is applied to said memory. According to a further embodiment of the method, a plurality of two most significant bits can be retrieved from four memory blocks. According to a further embodiment of the method, eight sense amplifiers can be provided and wherein each sense amplifier requires less time to generate a valid data signal than it takes to serially stream out two consecutive bits. According to a further embodiment of the method, the sets of most significant bit lines can be multiplexed with the remaining bit lines to be coupled with said sense amplifiers. According to a further embodiment of the method, the serial interface can be an SPI interface.

According to yet another embodiment, a serial memory may comprise a serial interface for receiving a read instruction and associated memory address; and a memory arranged in a plurality of memory blocks, n sense amplifiers operable to read n-bits from said memory, an n-bit data register coupled with said n sense amplifiers, a controller configured to couple the n sense amplifiers with most significant bit lines of each memory block before an entire address has been received through said serial interface to sense a plurality of respective most significant data bits while the remaining address bits are received and store the plurality of respective most significant data bits in said n-bit data register, wherein the controller is further configured to stream out one of the plurality of most significant data bits upon full reception of the memory address while coupling the sense amplifiers with at least the remaining bit lines of said memory and applying the entire address to said memory to retrieve and store the remaining data bits and stream out the remaining bits after the most significant bits have been streamed out.

According to a further embodiment, the above serial memory may further comprise a multiplexer controlled by the remaining address bits to select one set of the at least two significant data bits stored in said n-bit register. According to a further embodiment, the serial interface can be an SPI interface. According to a further embodiment, n=8 and wherein four memory blocks are provided and wherein two most significant bits are retrieved from each memory block. According to a further embodiment, each sense amplifier can be configured to require less time to generate a valid data signal than it takes to serially stream out two consecutive bits.

DETAILED DESCRIPTION

According to various embodiments, a method is proposed to perform a fast read using only a minimum number of sense amplifiers, for example 8 sense amplifiers, and a look-ahead read of the most significant x bits, for example 2 bits, of y consecutive bytes, for example 4 bytes. Thus, silicon area can be saved by using only a minimum number of sense amps.

Figure 1:
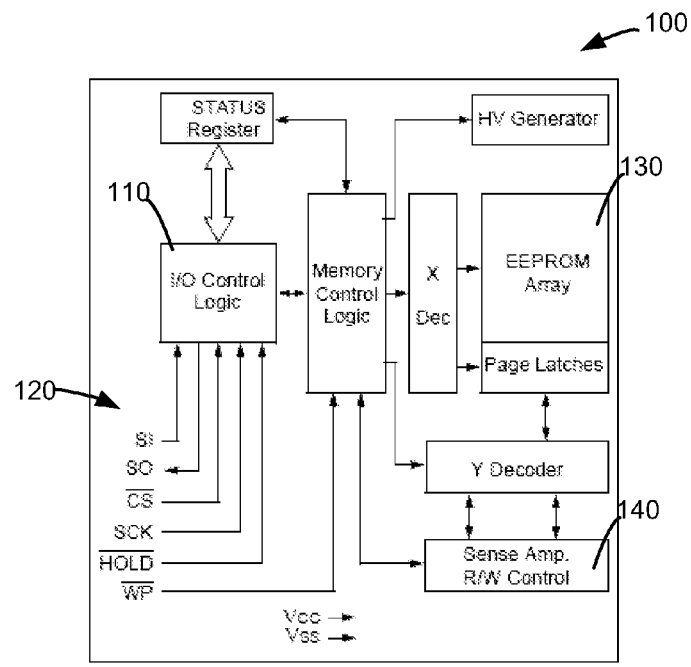
FIG. 1 shows a typical block diagram of a conventional serial memory device.

A conventional serial non-volatile memory device 100 is shown in FIG. 1. the device comprises an internal I/O control logic 110 and associated memory control logic. This control logic may include a state machine to provide for the necessary control signals during the respective execution of various functions. The memory array 130 is conventionally arranged and comprises word and bit lines. Block 140 connected to the Y decoder comprises the sense amplifiers that will be connected to respective bit lines of the memory array during a read process.

As mentioned above, for performing a data read within the serial memory 100, the serial interface 120 receives first the address information associated with the respective data read request. Once this address is received, the device 100 can apply this address to the decoders and receive the associated data byte through the sense amplifiers and store them in a latch or register. Then, the I/O interface 110 can serially output the retrieved data to the requesting device.

During this process certain significant time delay takes place. This time delay would lasts from the end of the address transmission until the sense amplifiers retrieved the requested data. This time delay would be inserted in the timing diagram shown in FIG. 5 at time t2. To be able to output data immediately without an additional time delay as for example required by the SPI protocol and shown in FIG. 5, a significant number of sense amplifiers need to be added. For example, in a conventional serial memory device that outputs 8 data bits (=1 byte) upon receipt of a read command to avoid the above mentioned time delay 32 sense amplifiers would be necessary to sense the data early enough during reception of the address and thus meet the speed requirements. This high number of sense amplifiers is necessary because the process of sensing the bit lines would have to be started at a time when not all address bits have been received. Once the remaining address bits have been received, this information is merely used to control a multiplexer to select the data provided by 8 of the 32 sense amplifiers which can be done with only a very short time delay that is within the SPI spec.

According to various embodiments, the requirement of a high number of sense amplifiers and associated control logic is avoided by using a look-ahead read. For example in serial SPI memory that outputs 8 data bits, a look ahead of bits 7 and 6 is performed shortly before all address bits have been received. To this end the memory is organized in a scrambled fashion to allow access to 4 consecutive bytes. Only the top address bits an . . . a2 are necessary to retrieve this entire data block consisting of four bytes. The requested data is within this block. However, not all data bits of these 4 consecutive bytes need to be sensed initially. Only 8 sense amplifiers are needed to perform the read function. To this end, the sense amplifiers are used twice. During a first read they are only used to retrieve the top two data bits of each of the four data bytes. Once the entire address is received, the previously missing two LSB of the address is now used to connect the sense amplifiers with the correct data byte and use the time necessary to serially transmit the previously retrieved top data bits to perform the sensing of the entire data byte. Once the top data bits have been transmitted, the sense amplifiers are finished and the correct entire data word is stored in the same latch or register. Now, the rest of the data d5 . . . d0 can be serially transmitted. No additional time delay occurs while the circuitry is kept at a minimum.

Figure 2:
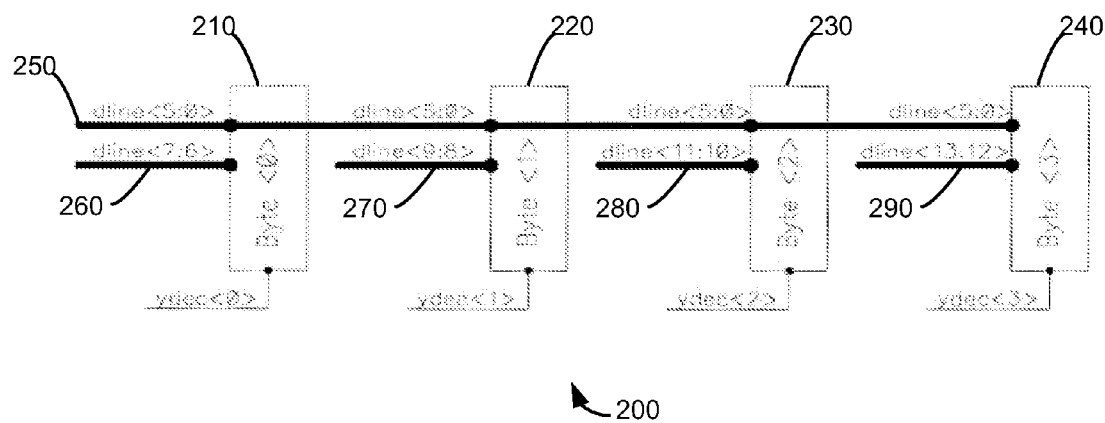
FIG. 2 shows the structure of the memory array according to various embodiments.

FIG. 2 shows a possible embodiment in which the memory array is scrambled into four memory blocks 210, 220, 230, and 240 that allow access to four consecutive bytes. The data or bit lines are split. the LSB bit lines 250 [bits 5:0] are combined because these data will be retrieved only from a single selected memory block 210 . . . 240. However, each block comprises separate bit lines for the MSB bit lines 260, 270, 280, and 290 [bits 7:6; 9:8, 11:10, and 13:12] because these bits need to be available in parallel. The bytes are thus arranged in groups of 4. For the first read all bytes in the group are addressed and a look-ahead only on bits lines 260, 270, 280 and 290 of all the bytes is performed. The second byte read will be performed using the entire available address and thus will be performed only on one of the four address blocks. During the second read, all data lines of a single memory block are coupled with the sense amplifiers. The internal architecture of the serial memory device of this embodiment has 14 data lines as shown in FIG. 2. Other configurations may apply as will be more apparent from the following description.

Figure 3:
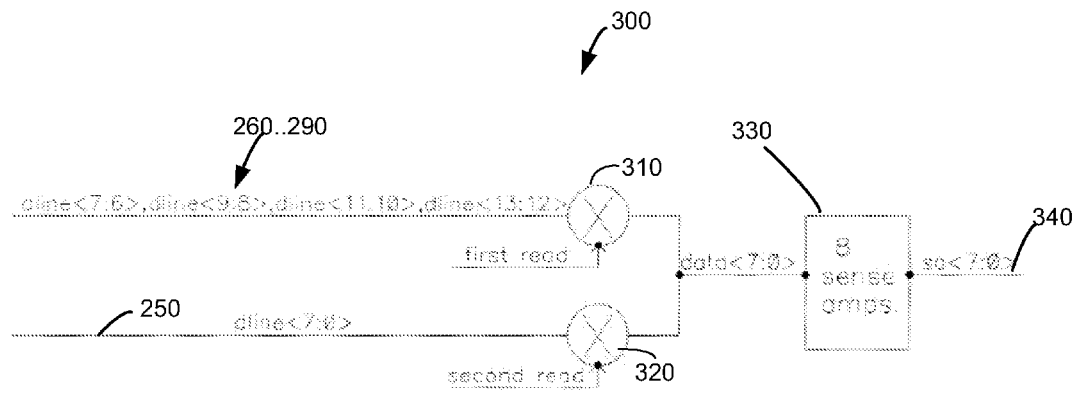
FIG. 3 shows an embodiment of the data acquisition in a serial memory device according to various embodiments.

FIG. 3 shows how a read can be performed in two read stages to avoid time delays. Data or bit lines 260 . . . 290 (data bits [7:6], [9:8], [11:10], and [13:12]) from memory blocks 210 . . . 240 are coupled with a first coupling device 310 and the combined data lines 250 (data bits [5:0]) are coupled with a second coupling device 320. The output of each coupling device 310, 320 are connected with the input of 8 sense amplifiers 330. The sensed data byte is available at data lines 340 connected to the output of the eight sense amplifiers 330.

Figure 4:
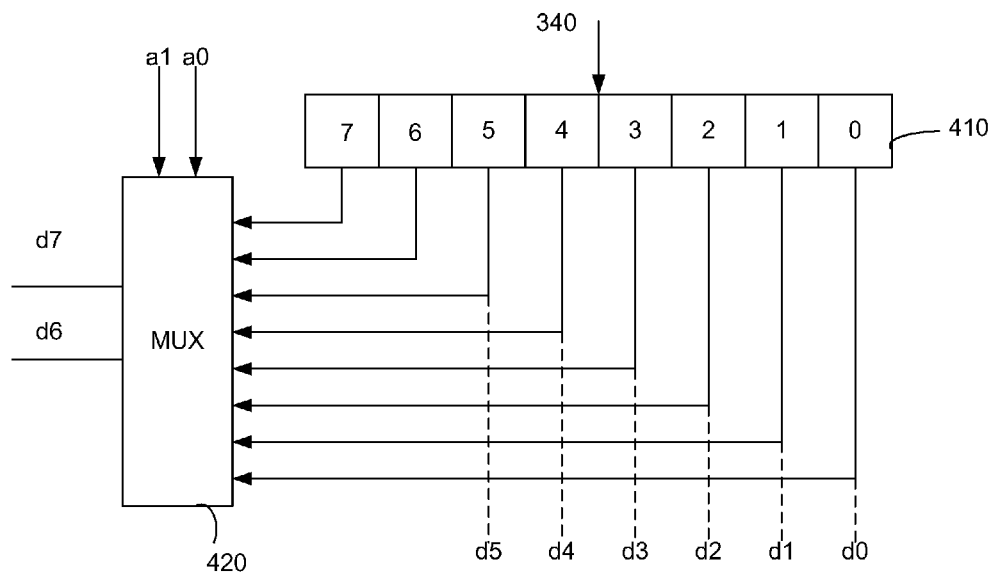
FIG. 4 shows the data latch following the sense amplifiers according to various embodiments.

FIG. 4 shows one embodiment of an associated data register or latch 410 coupled with the data lines 340. A multiplexer 420 is used to either coupled bits [7:6], [5:4], [3:2], or [1:0] of data register 410 with data lines d7 and d6. The lower data bits [5:0] of data register 410 can be directly accessed to form data bits d5 . . . d0 of the entire byte. Other arrangements that perform the same function may be used.

A first read is started after addresses an . . . a2 have been received and while addresses a1 and a0 have not yet been received. To this end, coupling devices 310, 320 may be controlled to operate as a multiplexer. The eight data lines 260 . . . 290 (data bits [13:6]) as shown in FIG. 3 will now be coupled with the eight sense amplifiers 330 by means of coupling device 310 while address lines A15 . . . A2 select the respective four consecutive bytes in the respective memory blocks 210 . . . 240. The read data are saved in data register or latch 410 so the sense amplifiers 330 become available for the next read. While the sense amplifiers operate, the remaining address bits a1 and a0 are received. The second read is then started while streaming out data bit d7 and data bit d6. At this point, the entire address is known and therefore the correct memory block can be selected and the associated data bits can be selected from the four previously stored bit pairs. As indicated in FIG. 3, data or bit lines 7:0 are connected with coupling device 320. as the top two bits d7 and d6 have already been retrieved and transmitted, it does not matter which top data bit lines 260 . . . 290 are connected to the sense amplifiers.

The sense amplifiers are used twice for a single byte read. This improved read architecture and method allows a reduced area for the sense block and still generates no additional delay and therefore meets the speed requirements of for example an SPI interface. All multiplexers may be preferably placed in the proximity of the sense amplifiers. No additional logic is needed in the X/Y decoders.

Figure 5:
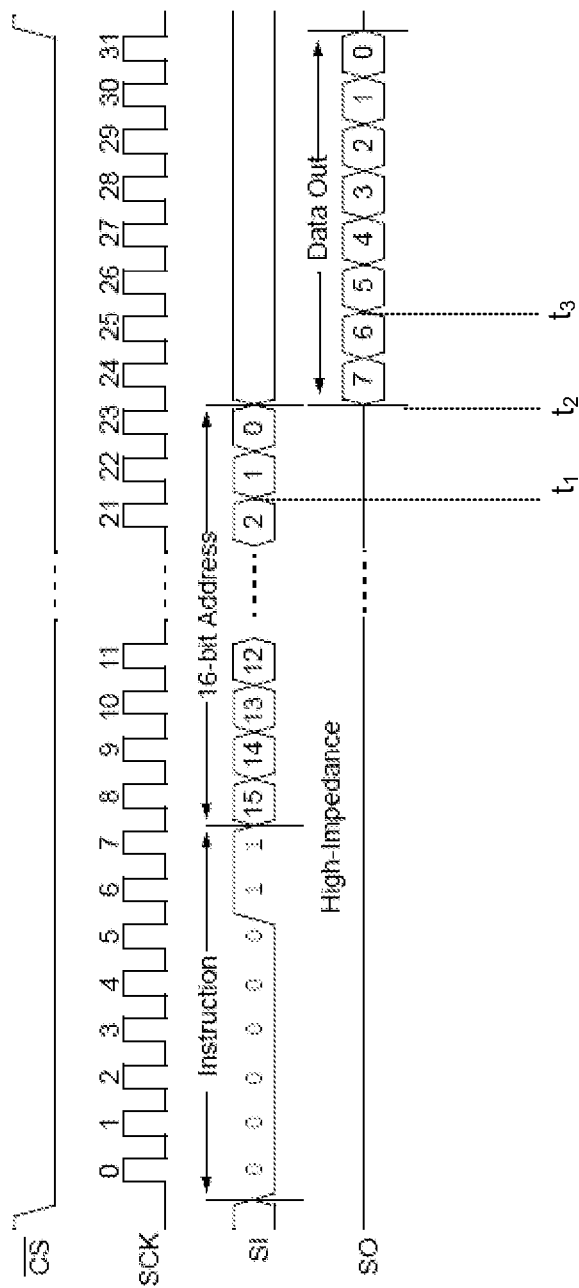
FIG. 5 shows a timing diagram according to various embodiments.

FIG. 5 shows an associated timing diagram with the typical four signal lines of an SPI interface. During clocks 0-7 the instruction is received followed by the memory address. Here a 16-bit address is received during clocks 8-23. Other embodiments may receive more or less address bits. Then, within half a clock the system switches from receiving to transmitting. Thus, output data line SO is switched from high impedance to carry the respective data bits. The first read of the memory is internally performed during clocks 22 and 23, thus starting at time t1. At this time t1.address bits 2-n, for example 2-15, are known. Thus, four data bytes are addressed at the same time and their values can be sensed by sense amplifiers in parallel. However as explained above only eight data or bit lines will be sensed wherein only the top two bits of each of the four bytes will be connected to the sense amplifiers. Thus, the temporary register 410 will store the two most significant bits of the four consecutive data bytes. After clock 23 at time t2, all address bits have been received and address bits a0 and a1 can be used to select the MSB bit pair from the temporary registers 410. To this end, multiplexer 420 can be controlled by address bits a0 and 1 to either select bits 6, 7 or bits 4, 5 or bits 3, 2 or bits 1, 0 of register 410 as the valid data bits d7 and d6. The I/O control logic can then immediately start streaming these bits back to the requesting device. The correct data bits 6 and 7 can thus be streamed out during clocks 24 and 25 while the system retrieves the remaining bits 0-5. The two cycles required for this are clock cycle 24 and 25 as shown in FIG. 5. Between times t2 and t3 the sense amplifiers are at least coupled with the remaining data bit lines 250 [data bits [5:0]. At time t3 these data bits have been transferred into register 410. Thus, the remaining data bits 0-5 can now be streamed out during clocks 26-31. All timing requirements of the SPI protocol are thus met with a minimum of additional circuitry.

No additional logic is needed in the X/Y decoders or bit latches. This improved read architecture allows a reduced area for the sense block in comparison with conventional serial memory devices. The area used for sensing is 33% of the area needed using 32 sense amps.

Figure 6:
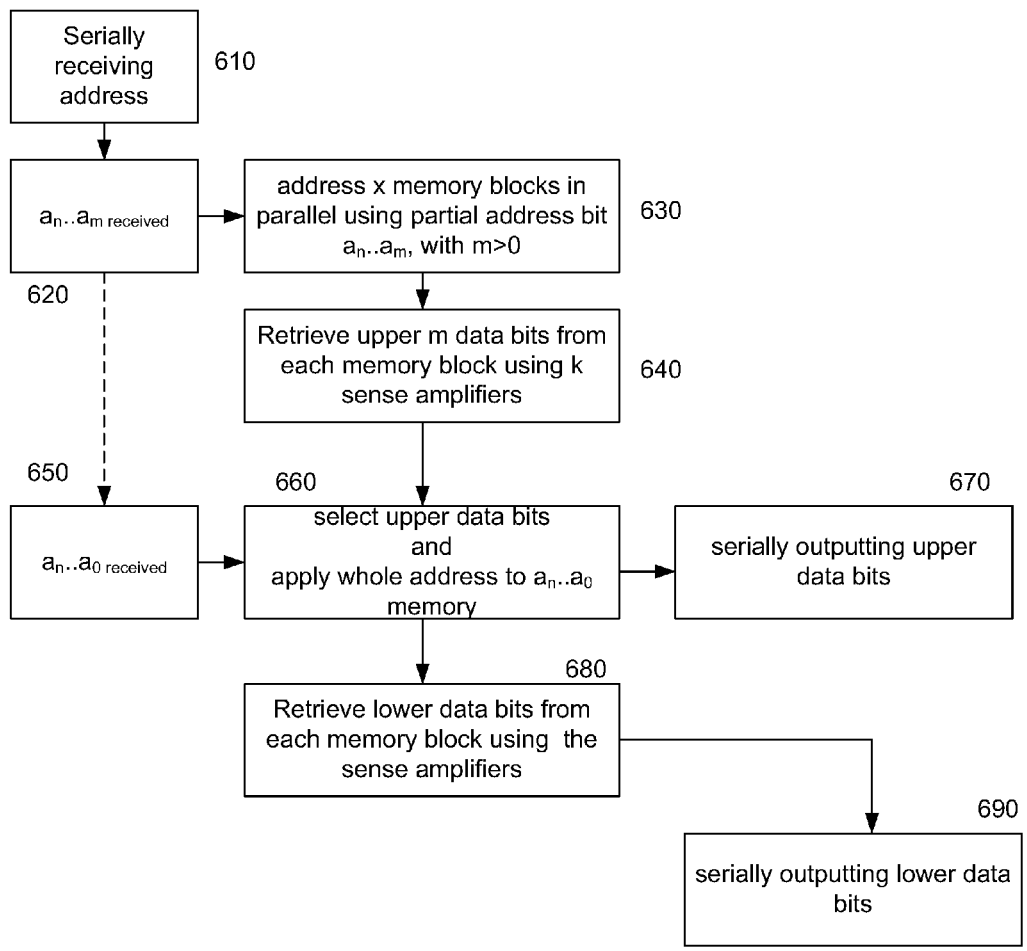
FIG. 6 shows a flow chart according to various embodiments.

FIG. 6 shows a more general flow chart of the method according to various embodiments. A memory is arranged in a plurality of x memory blocks wherein x>1. In step 610, a memory address starts being transmitted to the serial memory device. In step 620, address bits $a_n$ . . . $a_m$ have been received wherein m>1 and n is the highest address bit. As shown in the previous embodiments, m can be 2 and n can be 15 depending on the memory size. In step 630, address $a_n$ . . . $a_m$ is applied to the memory array and therefore the top data lines of the x memory blocks are addressed in parallel and coupled with k sense amplifiers. Then, m of the top bit lines of each memory block are coupled with mx sense amplifiers in step 640 to retrieve the respective data from the x memory blocks and stored in an intermediate register, wherein k>=mx. In the meantime all address bits have been received via the serial interface. Now the address bits $a_{m-1}$ . . . $a_0$ are used to select the respective top data bits from the intermediate register in step 660. Then, in step 670 the selected upper bits can be serially streamed out. Furthermore, in step 660 the entire address can be applied to the memory to select the correct entire data under the requested address and couple it with the sense amplifiers. In step 680, the entire data can now be decoded or at least the remaining lower data bits of the data can be decoded by the sense amplifiers and the result can be stored again in the intermediate register. The remaining lower data bits can then be streamed out in step 690. The values for m and x should be selected to the timing requirements and the sense amplifier section size. The method can thus be easily adapted to other memory organized differently, for example, in nibbles, words or double words.

What is claimed:

1. A serial memory comprising:
  memory arranged in a plurality of memory blocks,
  a serial interface for receiving a read instruction and associated memory address; and
  a controller configured to only store a plurality of most significant bits from each memory blocks which are accessed in parallel before an entire address has been received through said serial interface, wherein the controller is further configured to stream out one of the plurality of most significant bits upon full reception of the memory address while retrieving the remaining bits from memory using the entire address and stream out the remaining bits after the most significant bits have been streamed out, wherein most significant data bits of each memory block are accessible separately via a plurality of separate data lines and wherein remaining data bits of each memory block are coupled in parallel via common data lines.

2. The serial memory according to claim 1, comprising n sense amplifiers coupled with an n-bit register, and a switching unit operable during a first access, which uses a partial address, to couple at least two most significant data bit lines from each addressed memory block with said sense amplifiers and during a second access, which uses the entire address, to couple at least the remaining least significant data bit lines form the selected memory block selected by the entire address with the sense amplifiers.

3. The serial memory according to claim 2, further comprising a multiplexer controlled by the least significant address bits to select one set of the at least two most significant data bits stored in said register.

4. The serial memory according to claim 1, wherein the serial interface is an SPI interface.

5. The serial memory according to claim 1, wherein the memory is arranged in four memory blocks and two most significant bits are retrieved from each memory block.

6. The serial memory according to claim 5, comprising eight sense amplifiers coupled with an 8-bit register, and a switching unit operable during a first access, which uses a partial address, to couple the two most significant data bit lines from each addressed memory block with said eight sense amplifiers and during a second access, which uses the entire address, to couple at least the remaining least significant data bit lines provided by said memory with respective ones of said eight sense amplifiers.

7. The serial memory according to claim 6, further comprising a multiplexer controlled by two least significant address bits to select one set of two most significant data bits stored in said register.

8. A method of reading a serial memory arranged in a plurality of memory blocks, wherein each memory block comprises separate data lines connected to only a single memory block for a most significant bit set and common data lines connected to all memory blocks for remaining bits, the method comprising the steps of:
 transmitting a read instruction and associated memory address to a device comprising the serial memory via a serial interface; and
 receiving a partial memory address and applying said partial memory address to store from each memory block via the separate data lines the most significant bit set, respectively wherein each memory block is accessed in parallel by means of said partial memory address,
 upon receiving a remaining portion of the associated memory address:
  using the remaining portion to select one set of most significant bits of the previously stored most significant bit sets and streaming out the selected most significant bits, and
  using an entire address consisting of the partial memory address and the remaining portion to address and select only one of the plurality of memory blocks and to retrieve the remaining bits via the common data lines while said most significant bits are streamed out; and
 streaming out the remaining bits after said most significant bits have been streamed out.

9. The method according to claim 8, wherein the partial memory address is used to access one individual data in each memory block to form a consecutive data sequence.

10. The method according to claim 9, wherein sense amplifiers are coupled with the separate data lines for the most significant bit sets of each memory block when said partial memory address is applied to said memory and wherein the sense amplifiers are coupled with at least the common data lines of the selected memory block when said entire address is applied to said memory.

11. The method according to claim 8, wherein a plurality of two most significant bits are retrieved from four memory blocks.

12. The method according to claim 11, wherein eight sense amplifiers are provided and wherein each sense amplifier requires less time to generate a valid data signal than it takes to serially stream out two consecutive bits.

13. The method according to claim 12, wherein the sets of most significant bits are multiplexed with the remaining bits to be forwarded to said sense amplifiers.

14. The method according to claim 8, wherein the serial interface is an SPI interface.

15. A serial memory comprising:
 a serial interface for receiving a read instruction and associated memory address; and
 a memory arranged in a plurality of memory blocks,
 n sense amplifiers operable to read n-bits from said memory,
 an n-bit data register coupled with said n sense amplifiers,
 a controller configured to couple the n sense amplifiers with most significant data bit lines of each memory block before an entire address has been received through said serial interface to sense a plurality of respective most significant data bits while the remaining address bits are received and store the plurality of respective most significant data bits in said n-bit data register, wherein the controller is further configured to stream out the most significant data bits of a selected memory block upon full reception of the memory address while coupling the sense amplifiers with at least the remaining data bit lines of said memory and applying the entire address to said memory to retrieve and store the remaining data bits and stream out the remaining data bits after the most significant data bits have been streamed out.

16. The serial memory according to claim 15, further comprising a multiplexer controlled by the remaining address bits to select one set of the at least two most significant data bits stored in said n-bit register.

17. The serial memory according to claim 15, wherein the serial interface is an SPI interface.

18. The serial memory according to claim 15, wherein n=8 and wherein four memory blocks are provided and wherein two most significant bits are retrieved from each memory block.

19. The serial memory according to claim 15, wherein each sense amplifier is configured to require less time to generate a valid data signal than it takes to serially stream out two consecutive bits.

* * * * *